United States Patent [19]
Koizumi et al.

[11] Patent Number: 5,016,637
[45] Date of Patent: May 21, 1991

[54] MRI METHOD

[75] Inventors: Hideaki Koizumi, Katsuta; Ryuzaburo Takeda, Mito; Koichi Sano, Sagamihara; Tetsuo Yokoyama, Tokyo, all of Japan

[73] Assignee: Hitachi, Ltd., Tokyo, Japan

[21] Appl. No.: 356,418

[22] Filed: May 25, 1989

[30] Foreign Application Priority Data

May 27, 1988 [JP] Japan ................... 63-129937

[51] Int. Cl.⁵ .................................... A61B 5/055
[52] U.S. Cl. ..................... 128/653 OAF; 324/306; 324/309
[58] Field of Search ............... 128/653 A; 324/306, 324/309

[56] References Cited

U.S. PATENT DOCUMENTS

| 4,551,680 | 11/1985 | Macovski | 324/309 |
| 4,602,641 | 7/1986 | Feinberg | 324/306 |
| 4,649,345 | 3/1987 | Yoda et al. | 324/309 |
| 4,698,592 | 10/1987 | Feinberg | 324/309 |
| 4,777,957 | 10/1988 | Wehrli et al. | 128/653 AF |
| 4,801,884 | 1/1989 | Oppelt et al. | 324/309 |

Primary Examiner—Lee S. Cohen
Assistant Examiner—Krista M. Pfaffle
Attorney, Agent, or Firm—Antonelli, Terry, Stout & Kraus

[57] ABSTRACT

An MRI method is disclosed, by which, when liquid moving in a body to be examined stays in a predetermined region, this region is excited by using the nuclear magnetic resonance phenomenon and when the liquid thus excited moves from that excited region, a nuclear magnetic resonance signal produced by the excited spin and emitted during the relaxation time thereof is detected.

6 Claims, 6 Drawing Sheets

MRI METHOD

BACKGROUND OF THE INVENTION

This invention relates to an MRI method, and in particular to a method for imaging the coronary artery in a completely noninvasive and safe manner.

Heretofore, the coronary artery imaging by means of an X-ray coronary artery imaging device is almost the only method for imaging the coronary artery, except for the ultrasonic imaging method used for imaging the brain aneurysm of children (Kawasaki disease) as a special case. However, in order to execute this method, it is necessary to introduce a catheter by an operation and to inject a lot of iodine contrast media directly into the coronary artery. Therefore it is accompanied by danger and pain to a patient.

According to the prior art method described above it is necessary to introduce a catheter by an operation and to inject a lot of iodine contrast media directly into the coronary artery. Therefore it was a test, which was not only dangerous but also painful to a patient.

This test has not only a problem of exposure to X-ray but also a number of problems of allergy shock due to a lot of iodine contrast media, etc. other than that the catheter impairs the wall of the blood vessel or induced infarction.

That is, since the prior art technique is invasive and further it is fairly dangerous and painful, it cannot be applied to a general health examination and it is usual to effect examination using contrast media after appearance of symptoms of the disease.

On the other hand, if it is possible to image the coronary artery and to find strangulations, it is possible to prevent beforehand myocardial infarction by a coronary artery bypass operation, for which technique has been already established and which is thought to be safe.

SUMMARY OF THE INVENTION

The object of this invention is to provide an MRI method, by which blood in the blood vessel is not imaged by injecting iodine, but blood in the blood vessel is distinguished from the other (various sorts of textures, blood within the heart, etc.) by exciting nuclear spins in the blood by the nuclear magnetic resonance phenomenon and it is possible to image the coronary artery in a noninvasive and safe manner by utilizing the nuclear spin in the excited state as if it were contrast media.

The object described above can be achieved by an MRI method, by which, when liquid moving in a body to be examined stays temporarily in a predetermined region, the relevant region is excited by using the nuclear magnetic resonance phenomenon and when the liquid stated above moves to another region, a nuclear magnetic resonance signal emitted by the excited spin contained in the liquid stated above during the relaxation time is detected.

Concretely speaking, in the pulse sequence according to the MRI method described above, a high frequency 90° pulse having a sinc function waveform is applied as a rotating magnetic field resonating to the precession of the nuclear spin in the liquid in the predetermined region of the body to be examined after a predetermined period of time measured from the timing of a movement in the predetermined region of the body to be examined. At the same time only a slice portion having a certain thickness, which is perpendicular to the Z-direction is excited by applying a gradient magnetic field pulse in the Z-direction, which is the body axis direction of the body to be examined. The reason why the certain thickness is selected is that the function obtained by Fourier-transforming the sinc function is represented by a rectangular wave having a frequency region having a certain width and that this frequency region having the certain width is in accordance with a region having a certain width of the rotational frequency of the nuclear spin resonating to the gradient magnetic field. The thickness and the position of the exited slice portion are controlled by varying the waveform of the sinc function. Then, the time up to the generation of an echo being designated by $T_E$, a first high frequency 180° pulse having a sinc function waveform is applied after a period of time of $T_E/2$ and at the same time a gradient magnetic field pulse in the Y-direction is applied. In this way a signal is produced only by the slice portion having a certain thickness, which is perpendicular to the Y-direction. After that, a gradient magnetic field pulse in the Y-direction is applied as a phase encode pulse. The phase encode pulse is applied in order to obtain pixel information in the vertical direction, which is necessary for constructing the image. Then, after a period of time of $T_E$ measured from the application of the first 180° pulse, a second 180° pulse having a sinc function waveform is applied and at the same time a gradient magnetic field pulse in the X-direction is applied. In this way only a slice portion perpendicular to the X-direction is excited and as the result there exists an excited region, for which the X-, Y- and Z-directions are defined. An echo signal generated as the result of the excitation in this excited region is generated after a period of time of $T_E/2$ measured from the application of the second 180° pulse. At this time an echo signal is detected at a position, which is adjacent in the Z-direction to the excited region, to which the gradient magnetic field in the Z-direction is applied, and an image of the excited fluid flowing out from the excited region can be obtained.

The imaging method according to this invention will be explained for the case where the predetermined region is the aortic sinus of the heart and the other region is the coronary artery. Utilizing a peculiar property of the heart-coronary artery circulatory system that the blood pouring into the coronary artery stays once in the aortic sinus and flows in the coronary artery after having stagnated there for a moment, the nuclear spin (usually hydrogen spin) in the blood stagnating in the aortic sinus is excited by the nuclear magnetic resonance. Since a nuclear magnetic resonance signal is emitted by the spin in the blood, which has flowed from the aortic sinus in the coronary artery, during the relaxation time, it is possible to image the blood path in the coronary artery by using this signal.

According to this invention it is possible to distinguish clearly the blood flowing through the coronary artery from the blood within the heart existing in the neighborhood thereof by exciting the nuclear spin in the blood existing in the aortic sinus during the diastolic period and then imaging the nuclear spin used as the mark flowing in the coronary artery.

Further, since only the blood flow in the coronary artery is imaged and no textures other than the coronary artery are imaged, the form of the coronary artery can be obtained as an image. In this way strangulation or infarction of the coronary artery can be diagnosed.

Therefore it can be useful for medical treatment for myocardial infarction and angina pectoris.

A feature of this invention, which should be particularly emphasized, is that the coronary artery of the heart can be imaged in a completely noninvasive manner and without using any contrast media.

PREFERRED EMBODIMENT OF THE INVENTION

Hereinbelow an embodiment of this invention will be explained, referring to FIGS. 1 to 7.

Figure 1:
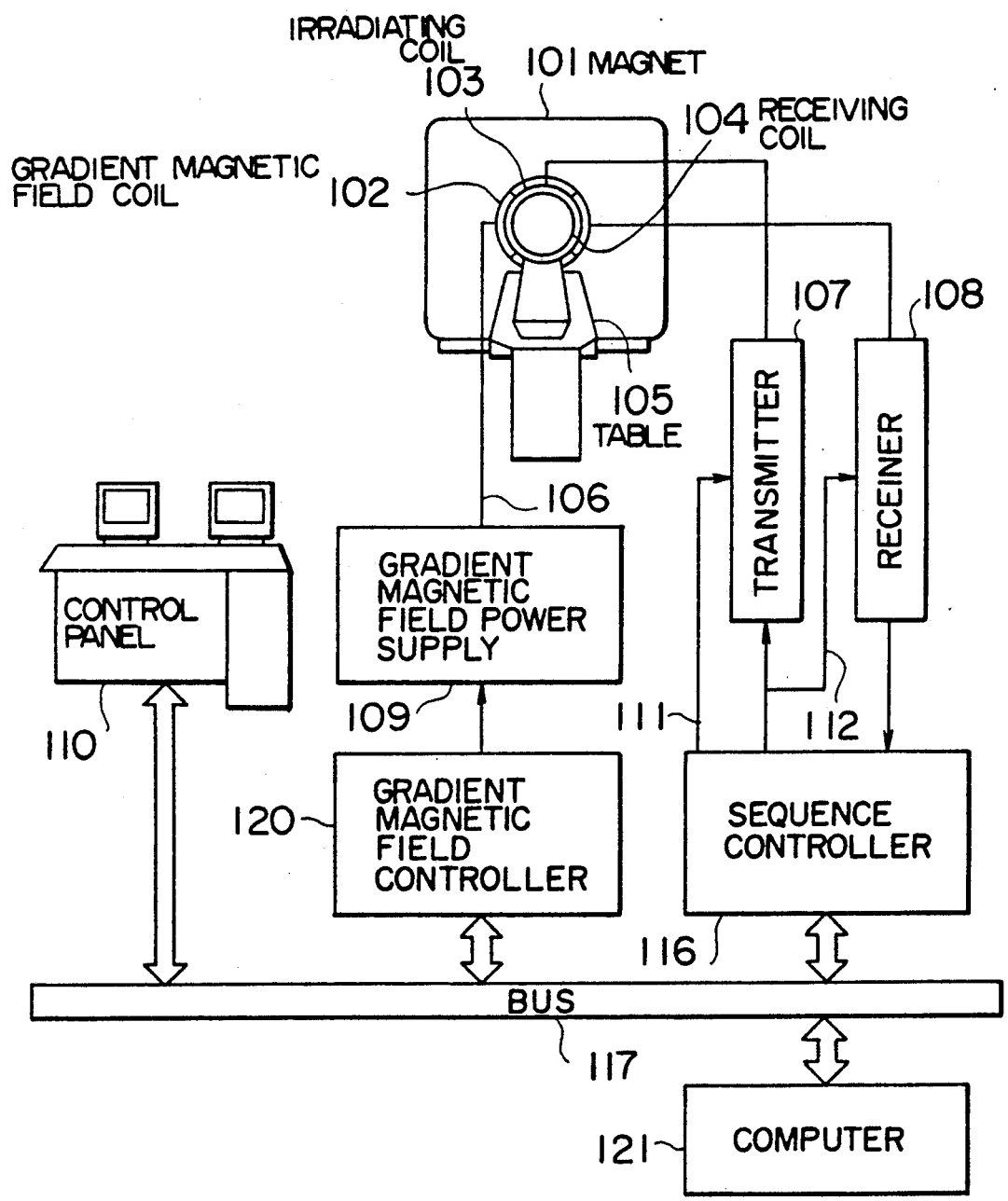
FIG. 1 is a block diagram of a device for realizing an embodiment of this invention.

FIG. 1 shows the outline of the MRI device. A magnet 101 constitutes the principal part of this system. There are three sorts of magnets 101, superconductive type, normal conductive type, and permanent magnet type. In this embodiment a superconductive magnet is used, in which the magnetic field intensity is 0.5T, the bore diameter is 1 m and the homogeneity of the magnetic field is 5 ppm/30 cm dsv (diameter of spherical volume).

A body to be examined lies on a table 105 for a patient and is sent to the center of the magnet 101. A gradient magnetic field for obtaining spatial position information is superposed on a static magnetic field by use of a gradient magnetic field coil 102. A high frequency electromagnetic wave (RF) producing the nuclear magnetic resonance (NMR) phenomena is sent from a transmitter 107 to an irradiating coil 103. The NMR signal generated by the body to be examined or the object substance to be examined is detected by a receiving coil 104 and transmitted to a receiver 108 by way of the coil 102. Since phase information representing the period of time from the peak of an excitation signal to the start point of the receiving timing of the echo signal is important in the NMR phenomena, the phase relation in the transmitter and the receiver is exactly synchronized through a receiver gate signal 112.

A gradient magnetic field power source 109 consists of a 3-channel power source in order to generate independently gradient magnetic fields in the three X-, Y- and Z-axis directions by way of the coil 102. Since the gradient magnetic fields are applied in the form of pulses, a high speed response is required. The generation of the pulses is controlled by a gradient magnetic field controller 120.

The operation of the system is effected by means of a control panel 110. The control panel 110 is provided with 2 CRTs apart from various sorts of keys. One of them is used for setting various sorts of parameters by the dialogue method and effecting the operation of the whole system and the other for displaying obtained images.

High speed calculation for the operation of the whole system and the construction of images are effected by a computer 121. The transmission and reception of signals between the computer 121 and each of the control systems is effected through a bus 117. The control of various sorts of pulse sequences is effected by a sequence controller 116. The central sequence among them relates to the combination of the high frequency pulse and the gradient magnetic field pulses.

Figure 2:
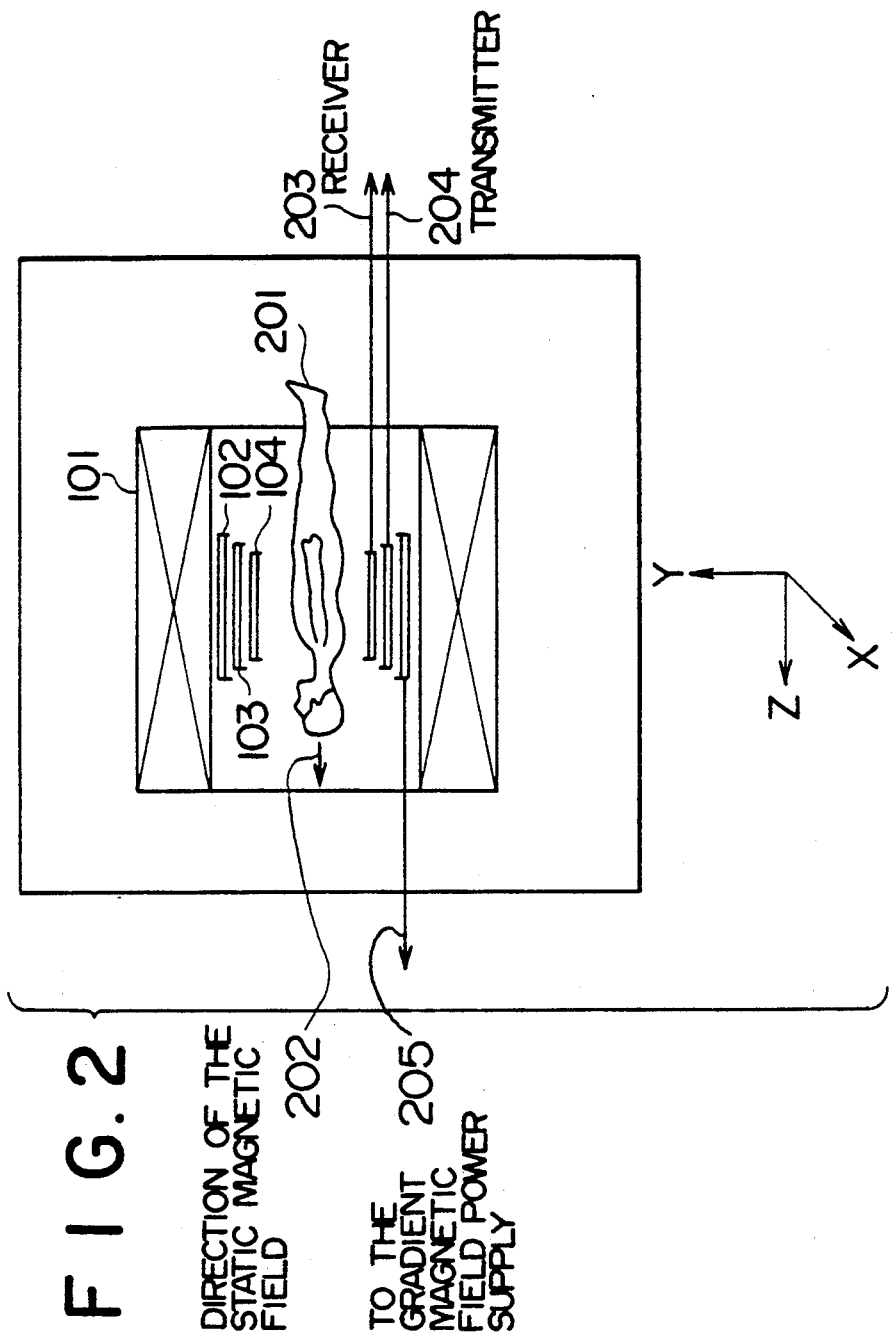
FIG. 2 is a cross-sectional view of the principal part of the device indicated in FIG. 1.

FIG. 2 is a cross-sectional view of the measuring part of the NMR imaging device for imaging portions of a patient 201. The superconductive magnet in FIG. 2 is constructed by the static magnetic field coil 101 held at the liquid He temperature, within which there are disposed the gradient magnetic field coil 102, the irradiating coil 103 and the receiving coil 104. The direction 202 of the static magnetic field is indicated in the figure and usually defined as the Z-axis. For the gradient magnetic field it is necessary to apply the gradient completely independently from each other in the three X-, Y- and Z-directions. Therefore there are disposed 3 coils for the X-, Y- and Z-directions.

Figure 3:
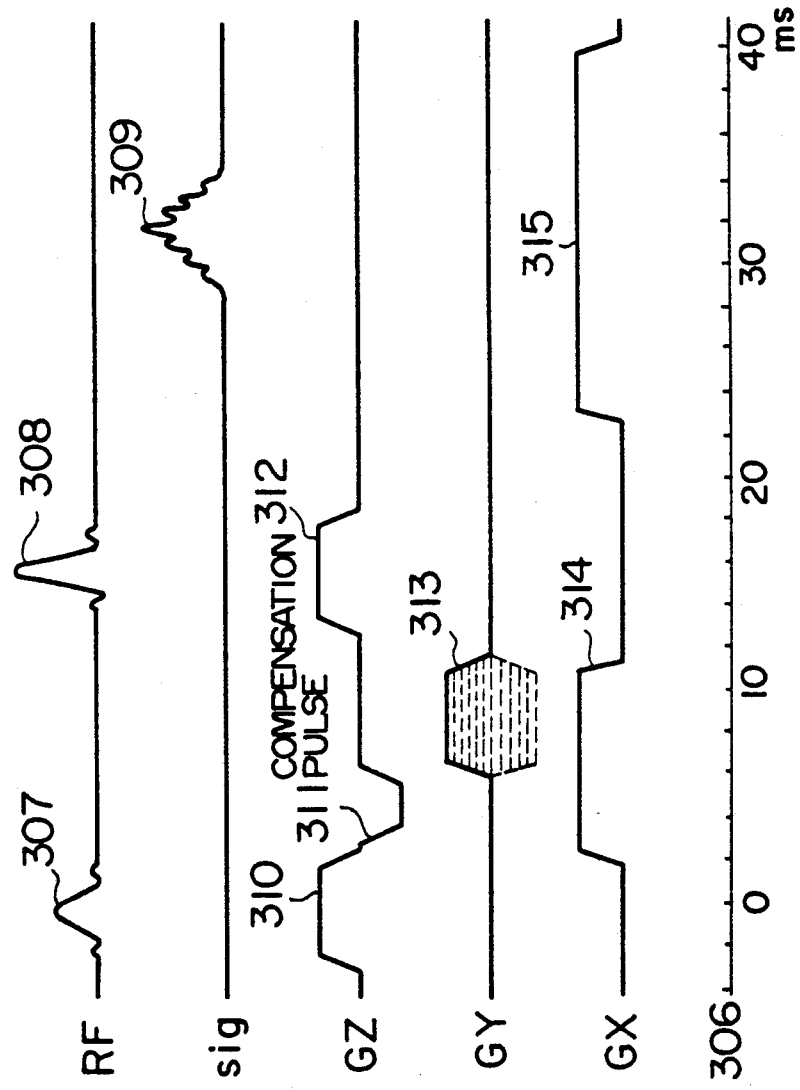
FIG. 3 is a scheme showing the pulse sequence at executing the 2-dimensional Fourier method.

In order to facilitate the understanding of this invention, FIG. 3 shows an example of the basic pulse sequence of the MRI method and the principle of the image reconstruction method called two-dimensional Fourier method will be described below.

In FIG. 3 there is shown from the top the pulse waveform of the high frequency electromagnetic wave RF, i.e. the high frequency electric power projected by the irradiating coil 103 to the body to be examined. Sig represents a signal obtained by amplifying the electromotive force induced in the receiving coil 104. GZ is a gradient magnetic field applied in the direction of the static magnetic field. A gradient magnetic field GY encodes the phase in the Y-axis direction. A gradient magnetic field GX is used for the one-to-one correspondence of the frequency to the ordinate in the X-direction. Since it is used generally for the generation of the spin echo, it may be interpreted as a reading out gradient magnetic field. The time axis 306 clarifies the relation in time for all the pulse sequencies thereto.

In the example indicated in FIG. 3 a sinc function is used for the waveform of the high frequency pulse RF. When the sinc function is Fourier-transformed a rectangular waveform is obtained, the abscissa representing the frequency. That is, since a sinc function in the time space is transformed into a rectangular waveform in the frequency space, it has only frequencies in a certain restricted region.

On the other hand the resonance condition in the NMR phenomena can be expressed by:

$$\omega_o = 2\pi f_o = \gamma[H_o + H_G(Z)] \tag{1}$$

where $f_o$ indicates the resonance frequency of the spin; $\gamma$ the gyromagnetic ratio; $H_o$ the magnetic flux density of the static magnetic field; and $H_G(Z)$ the magnetic flux density of the gradient magnetic field at the position Z.

At a particular position in the Z-direction there exists an intensity of the gradient magnetic field in the Z-direction giving a resonance frequency, which is equal to that in the frequency region after the Fourier transformation of the sinc function. Consequently, when a high frequency pulse 307 having the sinc function waveform throwing down the nuclear spin by 90° is applied and at the same time a gradient magnetic field pulse 310 in the Z-axis direction is applied, only a slice portion having a predetermined thickness perpendicular to the Z-direction is excited at a particular position in the Z-direction corresponding to the particular frequency region after the Fourier transformation of the sinc function waveform GZ gradient magnetic field pulse 312 is also applied in order to specify the slice plane in the Z-axis direction.

In a usual NMR imaging the frequency of the selective irradiation is set for a thickness of the cross-sectional slice comprised between 1 and 20 mm. In this embodiment a spin echo signal 309 is obtained by applying a 180° pulse 308 after the 90° pulse 307. (By the original two-dimensional Fourier method the spin echo is generated by the gradient magnetic field and no 180° pulse is used.)

The spin echo technique is one, by which the phase dispersing rapidly in an apparent transversal relaxation time $T_2$ due to an inhomogeneous magnetic field is rotated again in the converging direction by inverting it to 180° so as to be made again uniform after a certain period of time. The gradient magnetic field is a sort of inhomogeneous magnetic fields and in order to obtain signals having a uniform phase, it is necessary to invert the gradient magnetic field or to apply a 180° pulse similarly to the gradient magnetic field. In this case the rise and fall times of the real gradient magnetic field are finite. In practice a time of about 1 ms is necessary therefor. Consequently the phase becomes non-uniform during this transitory period. In order to compensate it, a compensation pulse 311 having the phase opposite to that of the pulse 310, and the same intensity as the latter, whose application time is however a half of the latter, is applied. In this way the rising and the falling are compensated and an effect can be obtained which is equivalent to that obtained in the case where an apparently complete rectangular wave is applied.

Now the phase encode will be explained.

In general, an image is constructed by small pixels obtained by dividing it vertically as well as horizontally. The phase encode pulse is a gradient magnetic field, which is applied in an every measurement while varying the intensity or the application time by a predetermined amount for obtaining pixel information in the vertical direction. Pixel information in the horizontal direction can be obtained by sampling the echo signal produced for every phase encode pulse by a number of times corresponding to the number of pixels in the horizontal direction. Data obtained by applying a series of phase encode pulses are two-dimensionally Fourier-transformed and thus a final cross-sectional image is obtained.

In FIG. 3 the gradient magnetic field encoding the phase is a gradient magnetic field 313. Since the phase encode value is determined by the integration of the intensity or the time of the gradient magnetic field for encode, it is the amplitude that is varied.

A gradient magnetic field GX is the gradient magnetic field applied in the X-direction. When the gradient magnetic field 314 in the X-direction is applied to the spin excited by a 90° pulse 307 and effecting a coherent precession, the frequency of the precession in the X-direction varies linearly, depending on the intensity of the magnetic field. It is possible to produce a spin echo signal 309 by giving the same gradient magnetic field 315 in the X-direction after a 180° pulse 308. Since the X-ordinate and the resonance frequency of the spin due to the gradient magnetic field in the X-direction are in a linear relation, it is possible to obtain the relation of the signal intensity vs. the X-ordinate by Fourier-transforming the spin echo signal 309. When this is again Fourier-transformed with respect to the phase encode direction (Y axis), at this time the relation of the signal coordinates with respect to the Y-ordinate. Since the signal distribution is obtained in this way for the X-Y plane, the tomographic image can be obtained by displaying the signal intensity on the CRT.

The above is the basic principle of the MRI method.

Figure 5:
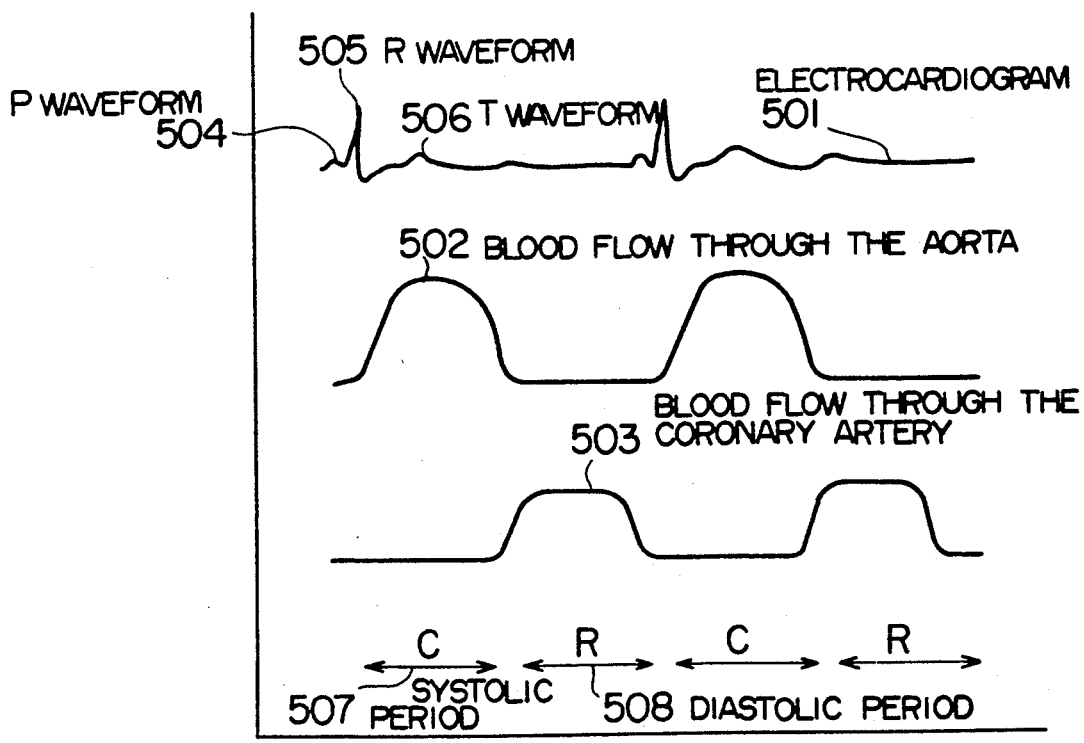
FIG. 5 is a scheme showing a waveform of the electrocardiogram and variations in blood flows through the aorta and the coronary artery in the course of time.
Figure 6:
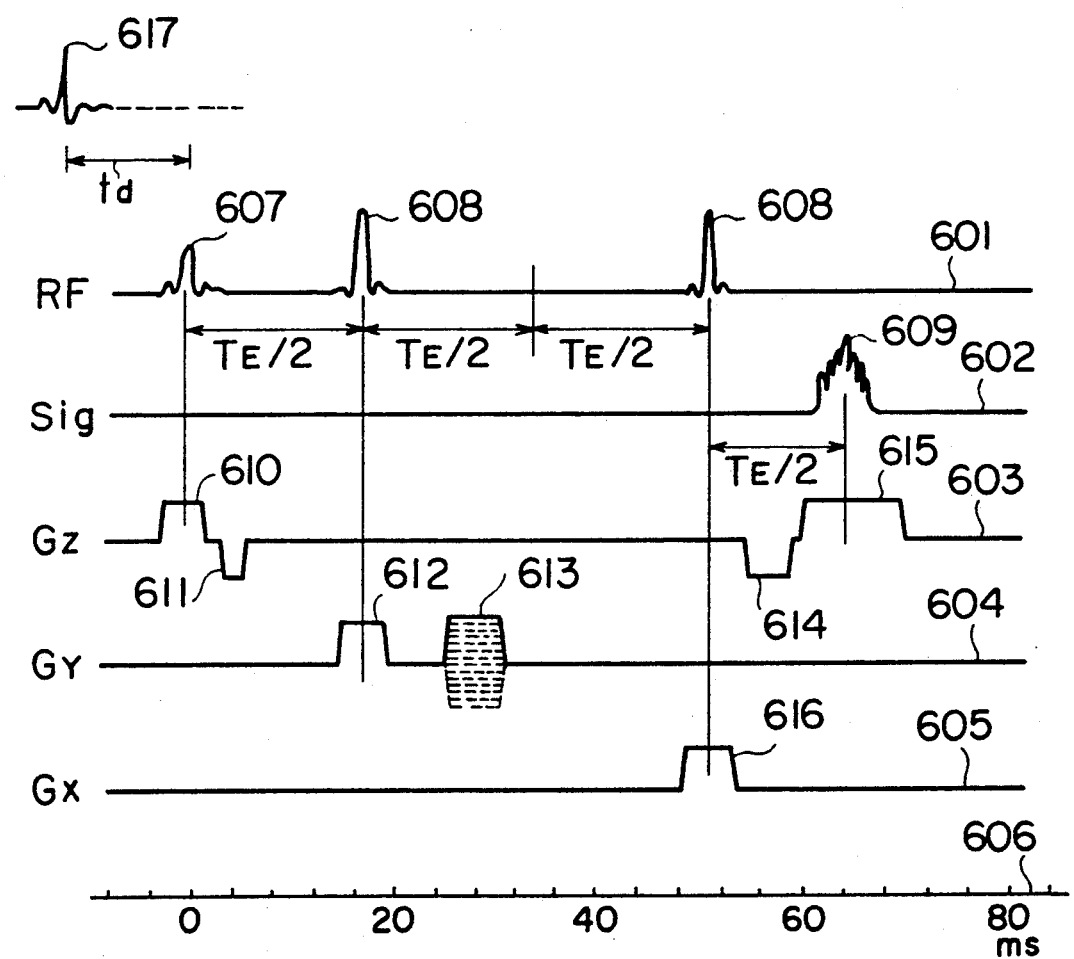
FIG. 6 indicates the pulse sequence in the embodiment.

Now, FIG. 6 shows the pulse sequence in an embodiment making the most of the features of this invention. A case, were the principal part of the coronary artery is imaged, will be explained, by utilizing the situation of the aortic sinus and the coronary artery in the spatial position indicated in FIG. 4, using this pulse sequence, and the movement of the blood ejected by the heart indicated in FIG. 5.

Figure 4:
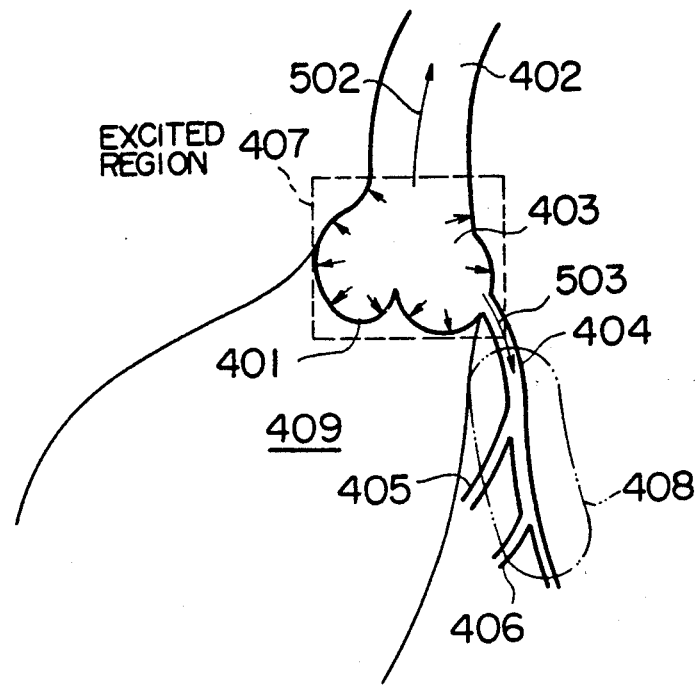
FIG. 4 is a scheme illustrating the inlet of the aorta and the principal part of the coronary artery.

FIG. 4 is a scheme illustrating the principal part of the aorta and the principal part of the coronary artery in the state at the last stage of the systolic period. The blood in the left ventricle is ejected to the aorta 402 by the contraction of the left ventricle. At the ejection the aortic valve 401 is open and it is closed at the last stage of the systolic period so that the reverse flow from the aorta 402 to the left ventricle 409 is prevented. Contrarily thereto, at this time, the aortic sinus (Valsalva sinus) 403, which is the root of the aorta 402, is subjected to a pressure by the aorta 402 inflated with the blood 502 ejected by the contraction of the left ventricle. Because of this pressure the blood flows in the principal part of the left coronary artery 404 as a blood flow 503. 405 and 406 are coronary arteries. 407 is an excited region and 408 is an observation region. FIG. 5 shows the movement of the blood flow 502 through the aorta and the blood flow 503 through the coronary artery. The R wave 505 in the electrocardiogram 501 is produced by the systole of the left ventricle and the blood flow 502 through the aorta begins to increase at the same time as the systole. Further, as described previously, the blood flow 503 through the coronary artery increases in the diastolic period 508. That is, the blood flow through the aorta and that through the coronary artery are opposite to each other in the phase.

In this embodiment the pulse sequence indicated in FIG. 6 is used as the pulse sequence. It differs from the pulse sequence indicated in FIG. 3 in that (a) 180° pulses 608 are used twice and a signal 609 is obtained by a second echo;

(b) concerning the two 180° pulses, a gradient magnetic field pulse 612 in the Y-direction and a gradient magnetic field pulse 616 in the X-direction are applied simultaneously; and (c) the signal is read out from the observed region in the Z-direction by using gradient magnetic fields 614 and 615 in the Z-direction.

Now the method for imaging the blood path described above will be explained, referring to FIG. 6 and FIG. 7 showing the observed region.

After a delay time td measured from the R wave in the electrocardiogram, a high frequency (RF) 90° pulse 607 is applied. A high frequency pulse 607 has a sinc function waveform and generates a rotating magnetic field having a particular frequency resonating to the precession of the nuclear spin in the blood. A gradient magnetic field pulse 610 in the Z-direction is applied at the same time as the 90° pulse 607. In this way only the slice having a certain thickness perpendicular to the Z-direction is excited.

Then the 180° pulse 608 is applied after a period of time of $T_E/2$. This 180° pulse 608 has also a sinc waveform and at this time a gradient magnetic pulse 612 in the Y-direction is applied at the same time. In this way the signal is produced only by a slice having a certain thickness perpendicular to the Y-direction. Since the relevant region has been already sliced perpendicularly to the Z-direction, another slice (block) perpendicular to the Y-direction is defined within that slice. After that, the slice is imaged 256 times while varying successively the intensity of the gradient magnetic field pulse in the Y-direction. This is called phase encode pulse 613.

Next, after a period of time of $T_E$ measured from the first 180° pulse 608, is applied again as a second pulse. At this time, since a gradient magnetic field pulse 616 in the X-direction is applied at the same time, further a slice perpendicular to the X-direction is selected.

As the result, only a block (region enclosed by a thick line indicated in FIG. 7) defined in the X-, Y- and Z-directions can emit the signal.

The spin echo signal 609 is generated after a period of time of $T_E/2$ measured from the second 180° pulse 608. At this time another gradient magnetic pulse 615 in the Z-direction is applied.

Figure 7:
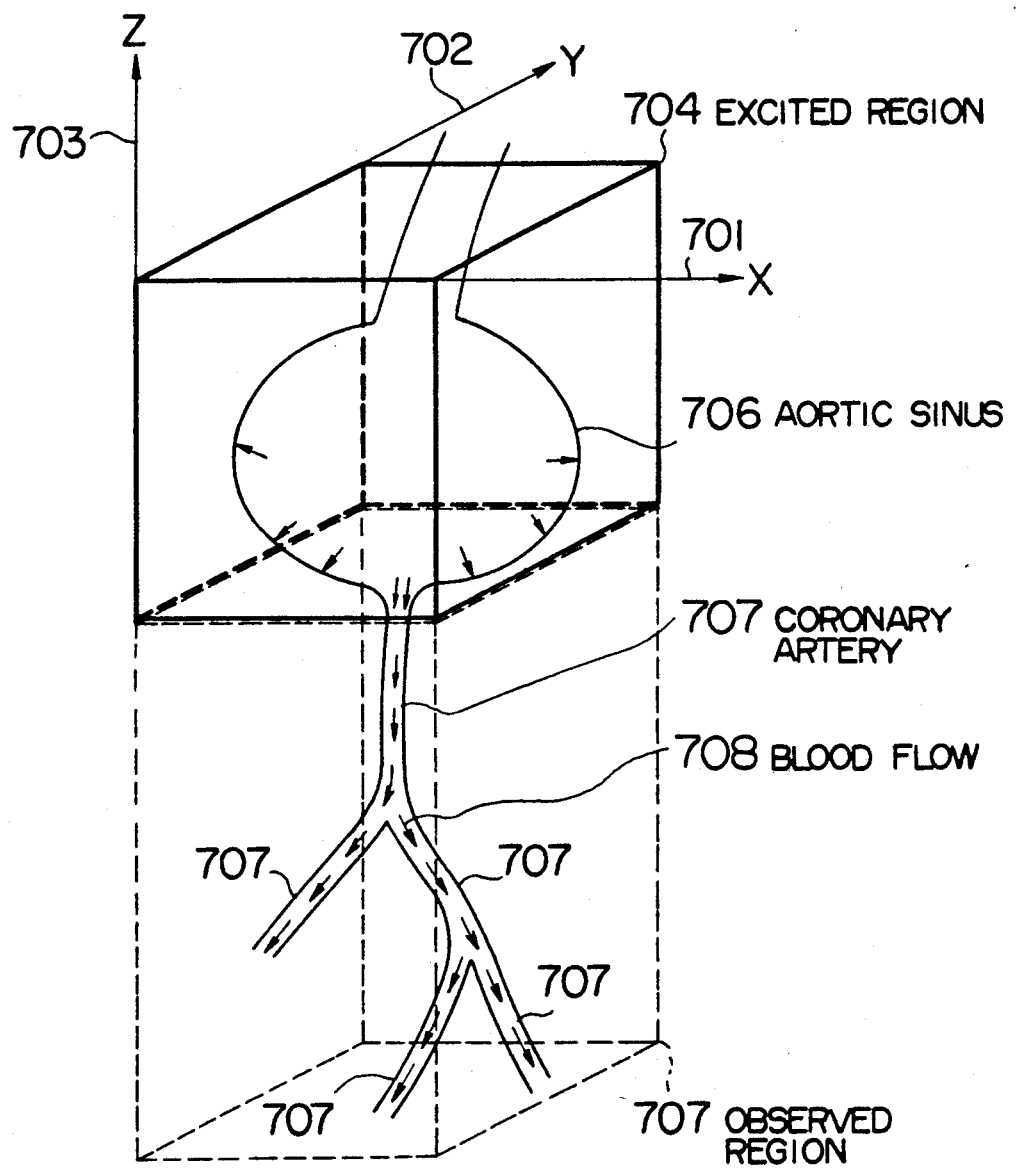
FIG. 7 is a scheme for explaining regions, where the coronary artery is observed by the method according to this invention.

The reading out of the generated echo signal is effected by disposing a band pass filter at the detector so as to detect only the echo signal having a frequency component corresponding to a position adjacent to the excited region in the Z-direction. The observed region in the Z-direction can be defined by defining the frequency at reading out the signal. If the blood in the excited region remains still, no signal is obtained, when the observation is effected outside of the excited region. However, in the case where the blood flows along the blood vessel, as indicated in FIG. 7, so as to flow out from the excited region, the echo signal is obtained from the blood flow, which has flowed out, also outside of the excited region. In this pulse sequence, the frequency at the read out region is intentionally so determined that it corresponds to a position adjacent to the excited region 704 and the echo signal can be obtained only from blocks located in the movement direction of the blood vessel. Consequently, for the region 705 to be observed, indicated by a broken line in FIG. 7, the still remaining portion in the region 704 emits no signal, and it is possible that the signal is emitted only by the blood vessel portion, to which the excited blood flows in.

Pulses 611 and 614 indicated in FIG. 6 are compensation pulses, which compensate the rise and fall times of the gradient magnetic fields 610 and 615 so as to produce the echo signal with a high precision.

The blood flow speed in the coronary artery is about 50 cm/s at the principal part of the coronary artery. Consequently, when the 180° pulse is so set that the period of time from the 90° pulse to the production of the echo signal is e.g. 100 ms, the intensity of the signal of the blood flowing through the coronary artery distant by 5 cm from the excited region 704 is the highest. By utilizing this phenomenon it is possible not only to image the coronary artery but also to examine the state and the speed of the blood flow through the coronary artery.

In the preferred embodiments above mentioned, the waveforms of sinc function are used as 90° pulse and 180° pulse of the RF pulse, but the waveforms of sinc like function which are formed by modifying the sinc function waveform can also be used.

We claim:

1. An MRI method comprising the steps of:
   (a) locating a body to be examined in a space defined by a Cartesian coordinate system of X, Y, and Z directions and in which a direction of a static magnetic field is in the Z-direction;
   (b) monitoring movement of a first region of interest of said body including detecting movement of liquid in said first region of interest;
   (c) exciting said first region in which said liquid moving in said body is present, by using a nuclear magnetic resonance phenomenon, when said liquid is temporarily nonmovable in said first region so that said liquid becomes excited;
   (d) detecting a nuclear magnetic resonance signal which is produced from said excited liquid at a second region different from said first region, when said excited liquid moves through said second region; and
   (e) reconstructing an image of a flow path of said excited liquid on the basis of said detected nuclear magnetic resonance signal;
   wherein said step of exciting comprises the steps of:
   (1) applying a high frequency 90° pulse and at the same time a gradient magnetic field in the Z-direction after a predetermined period of time measured from a specified movement of said first region;
   (2) applying a first high frequency 180° pulse and at the same time a gradient magnetic field pulse in the Y-direction after a period of time of $T_E/2$, $T_E$ representing two times of a period of time from the application of said high frequency 90° pulse to said first high frequency 180° pulse;
   (3) applying said gradient magnetic field pulse in the Y-direction as a phase encoded pulse after said Step (2); and
   (4) applying a second high frequency 180° pulse and at the same time a gradient magnetic field pulse in the X-direction after a period of time of $T_E$ measured from the application of said first high frequency 180° pulse; and
   said step of detecting the nuclear magnetic resonance signal comprises the step of applying a gradient magnetic field pulse in said Z-direction and detecting said nuclear magnetic resonance signal after a period of time of $T_E/2$ measured from the application of said second high frequency 180° pulse.

2. An MRI method according to claim 1, wherein said first region includes the left ventricle of a heart;
   said step of applying a high frequency 90° pulse includes the step of counting a predetermined period of time, starting from the systole of the left ventricle;
   said step of exciting said first region includes a step of controlling the generation of said gradient magnetic fields in the X-, Y- and Z-directions, the waveform of said high frequency 90° pulse and the waveform of said high frequency 180° pulse so that said first region is an aortic sinus of the heart.

3. An MRI method according to claim 2, wherein said step of detecting the nuclear magnetic resonance signal includes a step of:
   applying a step of detecting by means of a band pass filter said nuclear magnetic resonance signal having a frequency component corresponding to a position adjacent in the Z-direction to said first region.

4. An MRI method according to claim 3, wherein said step of applying said high frequency 90° pulse and said first and second 180° pulses includes the step of:

generating said pulses in waveforms of SINC or SINC like function.

5. An MRI method according to claim 4, wherein said step of applying said gradient magnetic field in the Z-direction includes the step of:

applying compensating uses, the polarity of which is opposite to that of said gradient magnetic field in the Z-direction, whose intensity is equal to that of the latter and the application duration of which is a half of that of the latter, just before or just after the application of said gradient magnetic field in the Z-direction.

6. An MRI method comprising the steps of:

(a) locating a body to be examined in a space defined by a Cartesian coordinate system of X, Y, and Z directions and in which a direction of a static magnetic field is in the Z- direction;

(b) monitoring movement of a first region of interest of said body including detecting movement of liquid in said first region of interest;

(c) exciting said first region in which said liquid moving in said body is present, by using a nuclear magnetic resonance phenomenon, when said liquid is temporarily nonmovable in said first region so that said liquid becomes excited;

(d) detecting a nuclear magnetic resonance signal which is produced from said excited liquid at a second region different from said first region, when said excited liquid moves through said second region; and (e) reconstructing an image of a flow path of said excited liquid on the basis of said detected nuclear magnetic resonance signal.

* * * * *